(12) United States Patent
Isokawa et al.

(10) Patent No.: US 7,242,033 B2
(45) Date of Patent: Jul. 10, 2007

(54) SEMICONDUCTOR DEVICE USING LED CHIP

(75) Inventors: Shinji Isokawa, Kyoto (JP); Tomoji Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/506,826

(22) PCT Filed: Feb. 24, 2003

(86) PCT No.: PCT/JP03/01994

§ 371 (c)(1),
(2), (4) Date: Sep. 7, 2004

(87) PCT Pub. No.: WO03/077312

PCT Pub. Date: Sep. 18, 2003

(65) Prior Publication Data

US 2005/0156187 A1 Jul. 21, 2005

(30) Foreign Application Priority Data

Mar. 8, 2002 (JP) ............... 2002-063684
Aug. 16, 2002 (JP) ............... 2002-237349

(51) Int. Cl.
*H01L 33/00* (2006.01)
*H01L 23/48* (2006.01)
*H01L 23/52* (2006.01)

(52) U.S. Cl. .................. 257/99; 257/100; 257/783
(58) Field of Classification Search ............. 257/676, 257/788, 793, 784, 782, 753, 783, 99–100
See application file for complete search history.

(56) References Cited

U.S. PATENT DOCUMENTS

| | | | |
|---|---|---|---|
| 6,291,274 B1 * | 9/2001 | Oida et al. | 438/123 |
| 6,486,543 B1 * | 11/2002 | Sano et al. | 257/684 |
| 6,558,980 B2 * | 5/2003 | Miyaki et al. | 438/112 |
| 6,872,661 B1 * | 3/2005 | Kwan et al. | 438/689 |

FOREIGN PATENT DOCUMENTS

| | | |
|---|---|---|
| EP | 1 156 535 | 11/2001 |
| JP | 62-23119 | 1/1987 |
| JP | 1-157424 | 10/1989 |
| JP | 7-106350 | 4/1995 |
| JP | 8-321634 | 12/1996 |
| JP | 2001-168400 | 6/2001 |
| JP | 2001-358367 | 12/2001 |
| WO | WO 99/60626 | * 11/1999 |

* cited by examiner

*Primary Examiner*—Shouxiang Hu
(74) *Attorney, Agent, or Firm*—Hamre, Schumann, Mueller & Larson, P.C.

(57) ABSTRACT

A semiconductor device includes an insulating substrate 2 having an obverse surface formed with a die pad 3, a rectangular semiconductor chip 7 such as an LED chip bonded to the die pad with a die bonding material 10, and a molded portion 9 made of a synthetic resin for packaging the semiconductor chip. The die pad 3 may be rectangular with dimensions close to those of the semiconductor chip or circular with a diameter close to the diagonal dimension of the semiconductor chip, whereby the positioning and orienting of the semiconductor chip can be accurately performed in bonding the semiconductor chip.

4 Claims, 10 Drawing Sheets

SEMICONDUCTOR DEVICE USING LED CHIP

BACKGROUND OF THE INVENTION

1. Field of the Invention

The present invention relates to a semiconductor device using a semiconductor chip, and particularly to a semiconductor device including a semiconductor chip bonded to a die pad and packaged with a molded portion made of a synthetic resin.

2. Description of the Related Arts

Generally, a light emitting diode lamp of the type described above includes an insulating substrate in the form of a chip, on which a die pad and a pair of first and second electrode terminals all of which are made of a metal film are formed so that the die pad is electrically connected to the first electrode terminal. The device further includes a semiconductor chip bonded to the die pad and electrically connected to the second electrode terminal.

To bond the semiconductor chip to the die pad electrically connected to the first electrode terminal in the semiconductor device, a thermally meltable die bonding material such as solder paste is used. Specifically, an appropriate amount of such die bonding material is applied to an upper surface of the die pad, and then the semiconductor chip is placed on the die bonding material. In this state, the die bonding material is once melted by heating and then hardened.

Conventionally, although the die pad has a rectangular configuration which is similar to the rectangular configuration of the semiconductor chip, the die pad is made considerably larger than the semiconductor chip to be bonded thereto, which causes the problems described below.

In bonding the semiconductor chip to the die pad, it is necessary to bond the semiconductor chip at or near the center of the die pad. However, when the die bonding material applied to the die pad is melted, the semiconductor chip is floated on the melted die bonding material, and the die bonding material spreads largely to all sides over the upper surface of the die pad. Therefore, in accordance with the spreading of the die bonding material to all sides, the semiconductor chip in the floated state moves along the upper surface of the die pad to be away from the center. Thus, when the die bonding material is hardened thereafter, the semiconductor chip is fixed to the die pad at a position offset from the center. Moreover, when the semiconductor chip is put on the die pad at an offset position, the semiconductor chip is fixed at the offset position of the die pad without correction.

Moreover, in bonding the semiconductor chip to the die pad, it is necessary to arrange the semiconductor chip so that each of the corners of the semiconductor chip is oriented in a predetermined direction. However, since the semiconductor chip floated on the melted die bonding material can rotate freely, each of the corners cannot be oriented in a predetermined direction. Thus, the semiconductor chip is fixed with the orientation of the corners deviated.

The positional deviation from the center and deviation of the corner orientation of the semiconductor chip may hinder the connection of a metal wire to a predetermined electrode of the semiconductor chip in electrically connecting the semiconductor chip to the second electrode terminal by wire bonding or may cause such a connection failure that an intermediate portion of the metal wire comes into contact with the semiconductor chip. Further, to package the semiconductor chip with a molded portion made of a synthetic resin, the molded portion need be made relatively large in view of the above-described two kinds of deviation, which leads to an increase in size and weight of the semiconductor device.

Particularly, when the semiconductor device is an LED device using a LED chip as a semiconductor chip, the position of the light source and the directionality of light emitted from the LED chip changes due to the positional deviation from the center and deviation of the corner orientation of the LED chip, so that variation of the directionality of light is large.

DISCLOSURE OF THE INVENTION

An object of the present invention is to solve the problems described above.

According to a first aspect of the present invention, there is provided a semiconductor device comprising: an insulating substrate having an obverse surface formed with a rectangular die pad made of a metal film and a pair of electrode terminals made of a metal film; a rectangular semiconductor chip bonded to an obverse surface of the die pad with a die bonding material; and a molded portion made of a synthetic resin for packaging the semiconductor chip. The rectangle of the die pad has a length and a width which are 0.50 to 1.50 times the length and the width of the rectangle of the semiconductor chip, respectively.

By making the length and the width of the rectangle of the die pad 0.50 to 1.50 times the length and the width of the rectangle of the semiconductor chip, the following advantages are provided. When the semiconductor is placed on the die pad, the side surfaces of the semiconductor chip may not be in parallel with the side surfaces of the die pad or the semiconductor chip may be offset from the center of the die pad. Even in such a case, the surface tension of the die bonding material acts simultaneously to each side of the semiconductor chip and each side of the die pad. As a result, as will be described later in detail, by self alignment due to the surface tension, the semiconductor chip is automatically corrected so that each side of the semiconductor chip become parallel or generally parallel with a respective side of the die pad, or each of the corners of the semiconductor chip is oriented constantly in a predetermined direction. Further, the LED chip is automatically corrected to locate at or near the center of the die pad.

Thus, in bonding the semiconductor chip to the die pad on the insulating substrate, by the self alignment due to the surface tension of the die bonding material, the deviation of the semiconductor chip from the center of the die pad can be reduced, and each of the corners of the semiconductor chip can be oriented accurately in a predetermined direction so that each side of the semiconductor chip become parallel or generally parallel with a respective side of the die pad. Therefore, the molded portion for packaging the semiconductor chip can be made smaller as compared with that of the prior art, whereby the size and weight of the semiconductor device can be reduced.

Particularly, in the first aspect, when the semiconductor device is a chip-type LED device including an LED chip as the semiconductor chip and a light-permeable molded portion, the change of the light source position and the directionality can be suppressed, whereby variation of the directionality can be reduced.

Further, in the first aspect, the die pad may have a side surface integrally formed with a narrow extension projecting outward from the die pad. With such an arrangement, part of the die bonding material applied onto the die pad spreads onto the obverse surface of the narrow extension. As a result, the thickness of the die bonding material on the obverse surface of the die pad can be reduced while the self alignment by the die bonding material is assured. Therefore, the float height from the die pad, height variation and inclination of the semiconductor chip can be reduced, and the amount of sinking of the semiconductor chip in the die bonding material is also reduced. Thus, short-circuiting in the semiconductor chip can be suppressed. Moreover, when the semiconductor chip is an LED chip, the reduction of the amount of light emitted from the LED chip can be prevented.

Further, in the first embodiment, the die pad may be formed with a recess of a size insufficient to receive the semiconductor chip. With such an arrangement, part of the die bonding material applied to the obverse surface of the die pad enters the recess. As a result, the thickness of the die bonding material on the obverse surface of the die pad can be reduced while the self alignment by the die bonding material is assured. Therefore, the float height from the die pad, height variation and inclination of the semiconductor chip can be reduced, and the amount of sinking of the semiconductor chip in the die bonding material is also reduced. Thus, short-circuiting in the semiconductor chip can be suppressed.

When the provision of the narrow extension is combined with the provision of the recess, higher advantages can be obtained than when only either one of the above is provided.

According to a second aspect of the present invention, there is provided a semiconductor device comprising: an insulating substrate having an obverse surface formed with a die pad made of a metal film and a pair of electrode terminals made of a metal film; a semiconductor chip which is square or generally square as viewed in plan and bonded to an obverse surface of the die pad with a die bonding material; and a molded portion made of a synthetic resin for packaging the semiconductor chip. The die pad is circular as viewed in plan and has a diameter which approximates the diagonal dimension of the semiconductor chip, and wherein a narrow patterned conductor made of a metal film is provided between the die pad and one of the electrode terminals to integrally connect the die pad and the electrode terminal to each other.

With such an arrangement, a thermally meltable die bonding material is applied to the obverse surface of the die pad, and then the semiconductor chip is placed thereon. Thereafter, the entirety is heated to a temperature above the melting point of the die bonding material.

By the heating, the die bonding material is melted, so that the semiconductor chip is floated on the melted die bonding material. At this time, the melted die bonding material spreads, while alloying, over the entire obverse surface of the die pad and also over the bottom surface and each of four side surfaces of the semiconductor chip. Thus, surface tension of the melted die bonding material acts between the circumferential edge of the die pad and each of the four side surfaces of the semiconductor chip.

In this case, since the semiconductor chip is square or generally square while the die pad is circular with a diameter which approximates the diagonal dimension of the semiconductor chip, the semiconductor chip floating on the melted die bonding material undergoes self alignment for moving the LED chip to a position where the surface tension acts equally onto each of the four side surfaces of the semiconductor chip. Therefore, even when the semiconductor is placed at a position offset from the center of the die pad, the position is automatically corrected by self alignment due to the surface tension for the four sides so that the semiconductor chip is located at or near the center of the die pad.

Further, part of the melted die bonding material spreads also toward the narrow patterned conductor made of a metal film and connecting the die pad to one of the electrode terminals. Therefore, a bulged portion projecting on to the narrow patterned conductor is formed at the outer circumference of the molten solder paste, and surface tension acts also between the side surfaces of the semiconductor chip and the bulged portion spreading onto the narrow patterned conductor. Therefore, by the self alignment due to the behavior of the solder paste to make the surface tension act equally onto each of the side surfaces, the semiconductor chip floating on the melted die bonding material is automatically corrected so that one of the four corners of semiconductor chip is oriented toward the narrow patterned conductor.

In this way, the semiconductor chip is automatically corrected (self alignment) to locate at or near the center of the die pad, and at the same time, automatically corrected (self alignment) so that one of the four corners of the semiconductor chip is oriented toward the narrow patterned conductor.

By the subsequent hardening of the melted die bonding material by cooling, the semiconductor chip is bonded at or near the center of the die pad connected to one of the electrode terminals, with one of the corners of the semiconductor chip oriented toward the narrow patterned conductor connected to the die pad so that each of the corners is constantly oriented in a predetermined direction. Therefore, it is possible to reduce the positional deviation of the semiconductor chip from the center of the die pad and the deviation of the corner orientation of the semiconductor chip.

As a result, the possibility of a connection failure, which may occur in electrically connecting the semiconductor chip to one of the electrode terminals by wire bonding using a metal wire, is reliably reduced. Further, when the semiconductor chip is to be packaged with a molded portion made of a synthetic resin, the molded portion can be made smaller by as much as the above two kinds of deviation is reduced, whereby the size and weight of the semiconductor device can be reduced.

As noted above, the self alignment to locate the semiconductor chip at or near the center of the die pad and to orient the semiconductor chip so that one of the corners is oriented toward the narrow patterned conductor can be reliably achieved by making the diameter of the die pad 0.6 to 1.5 times the diagonal dimension of the semiconductor chip.

In the second aspect, the die pad may be arranged between the paired electrode terminals arranged on a generally straight line, and the narrow patterned conductor may be arranged to extend from the circumference of the die pad at a position deviating by 45 degrees from the line of the electrode terminals. With such an arrangement, when the die bonding material is melted, one of the corners of the semiconductor chip is oriented toward the patterned conductor at the 45 degree position. Therefore, the semiconductor chip can be bonded so that, among the four sides of the semiconductor chip, a pair of opposite sides extend parallel or generally parallel with the line of the electrode terminals while the other pair of opposite sides extend perpendicularly or generally perpendicularly to the line of the electrode terminals. Therefore, the width and the length of the semiconductor device can be made smaller than when the four sides of the semiconductor chip are inclined relative to the line of the electrode terminals. Accordingly, the size and weight of the semiconductor device can be advantageously reduced.

In the second aspect again, when the semiconductor device is a chip-type LED device including an LED chip as the semiconductor chip and a light-permeable molded portion, the change of the light source position and the directionality can be suppressed, whereby the variation of the directionality can be reduced.

In the second aspect again, the die pad may be formed with a recess of a size insufficient to receive the semiconductor chip, similarly to the first aspect. With such an arrangement, the variation of the float height of the semiconductor chip from the die pad as well as the inclination of the semiconductor chip can be reduced, and short-circuiting in the semiconductor chip can be suppressed.

According to a third aspect of the present invention, there is provided a semiconductor device comprising: a die pad made of a metal plate and a pair of electrode terminals made of a metal plate; a semiconductor chip which is square or generally square as viewed in plan and bonded to the die pad with a die bonding material; and a molded portion made of a synthetic resin for packaging the semiconductor chip. The die pad is circular as viewed in plan and has a diameter which approximates the diagonal dimension of the semiconductor chip, and a narrow patterned conductor made of a metal plate is provided between the die pad and one of the electrode terminals to integrally connect the die pad and the electrode terminal to each other. With such an arrangement, a semiconductor device which does not utilize an insulating substrate but utilizes a metal plate is provided.

Similarly to the second aspect, the following arrangements are also applicable to the third aspect:
i) to make the diameter of the die pad 0.6 to 1.5 times the diagonal dimension of the semiconductor chip;
ii) to arrange the die pad between the paired electrode terminals arranged on a generally straight line and to arrange the narrow patterned conductor so as to extend from the circumference of the die pad at a position deviating by 45 degrees from the line of the electrode terminals; and
iii) to make the semiconductor device a chip-type LED device including an LED chip as the semiconductor chip and a light-permeable molded portion.

Other objects, features and advantages of the present invention will become clearer from the description of the embodiments given below with reference to accompanying drawings.

DETAILED DESCRIPTION OF THE PREFERRED EMBODIMENTS

Figure 1:
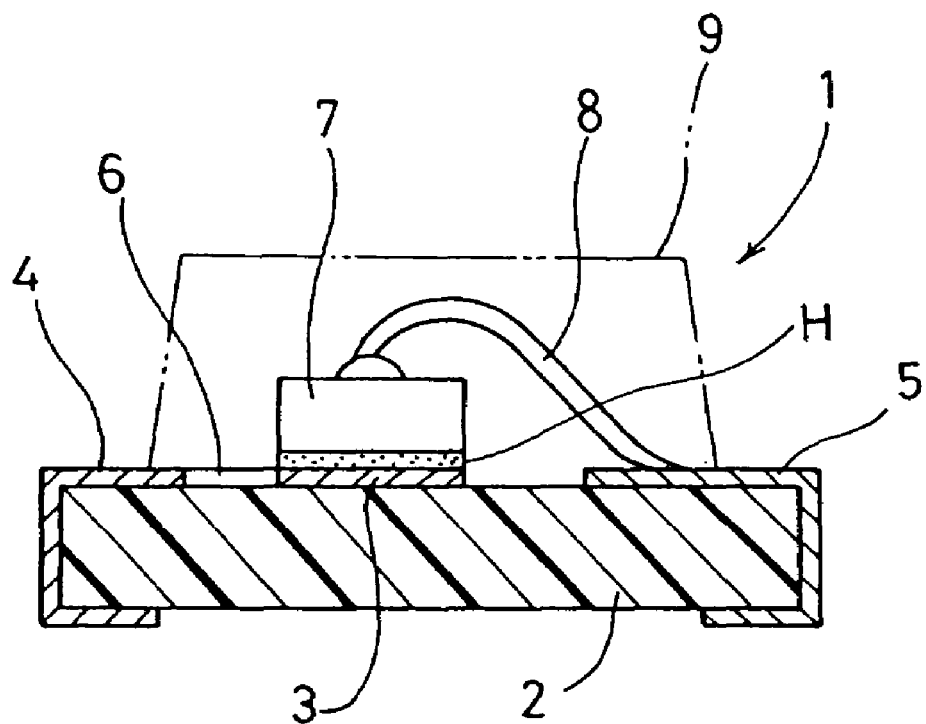
FIG. 1 is a longitudinal sectional view showing a chip-type LED device according to a first embodiment.

FIGS. 1-7 show a first embodiment of the present invention.

Indicated by the reference sign 1 in these figures is a chip-type LED device as an embodiment of semiconductor device.

The chip-type LED device 1 includes an insulating substrate 2 in the form of a chip. The insulating substrate 2 has an upper surface formed with a rectangular die pad 3 and a pair of terminal electrodes 4, 5 all of which are made of a metal film, and a narrow patterned conductor 6 made of a metal film and electrically connecting the terminal electrode 4 to the die pad 3.

The chip-type LED device 1 further includes an LED chip 7 bonded to the upper surface of the die pad 3, a thin metal wire 8 connecting the LED chip 7 and the terminal electrode 5 by wire bonding, and a molded portion 9 made of a light-permeable synthetic resin such as a transparent resin for packaging the LED chip 6 and the wiring pattern 6.

The paired terminal electrodes 4, 5 extend from the upper surface onto an end surface and a lower surface of the insulating substrate 2.

The bonding of the LED chip 7 onto the die pad 3 on the insulating substrate 2 is performed as follows.

Figure 3:
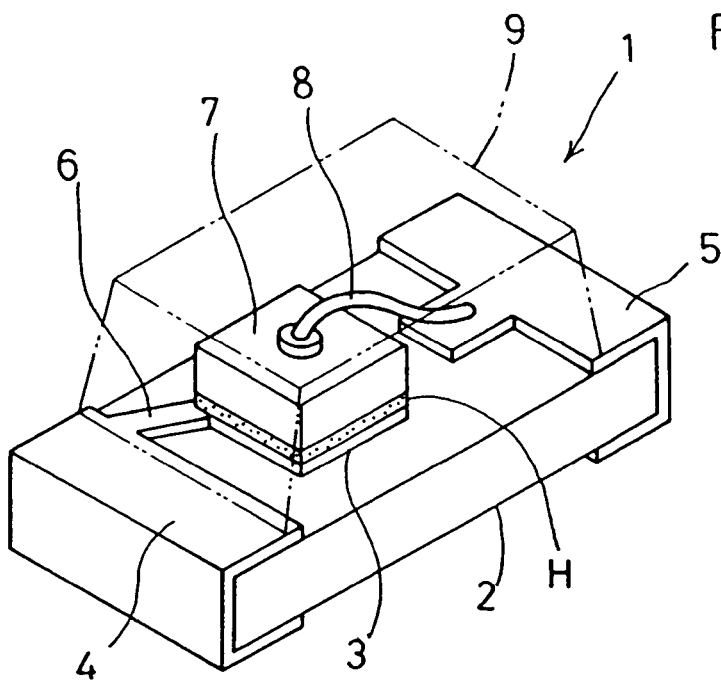
FIG. 3 is a perspective view showing the chip-type LED device according to the first embodiment.
Figure 4:
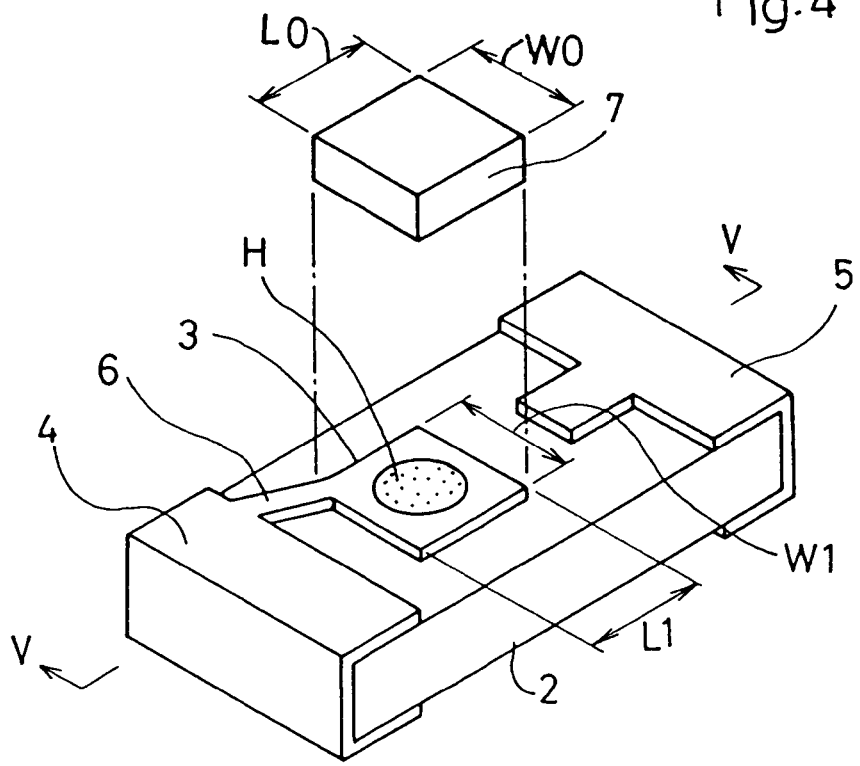
FIG. 4 is an exploded perspective view of the first embodiment.

To mount the LED chip 7 which is a typical rectangular one having a length L0 and a width W0, the length L1 and the width W1 of the die pad 3 are made equal or generally equal to the length L0 and the width W0 of the LED chip 7 so that the die pad becomes congruent or generally congruent to the LED chip 7. In bonding, an appropriate amount of solder paste H is applied to the upper surface of the die pad 3, as shown in FIG. 3. Then, as shown in FIG. 4, the LED chip 7 is placed on the solder paste H. Thereafter, the solder paste in this state is heated to a temperature above the melting point of the solder and then cooled for hardening.

Figure 5:
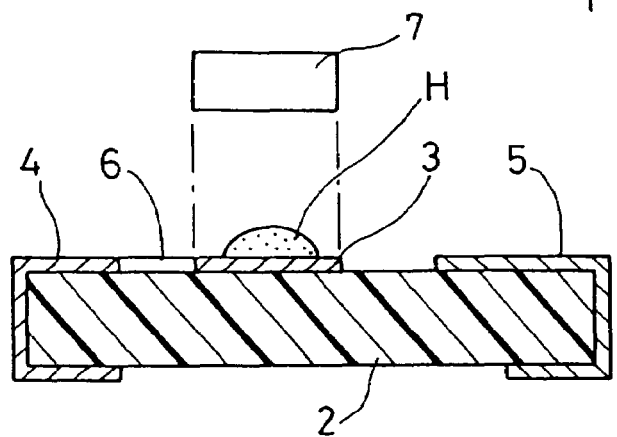
FIG. 5 is a sectional view taken along lines V-V in FIG. 4.
Figure 6:
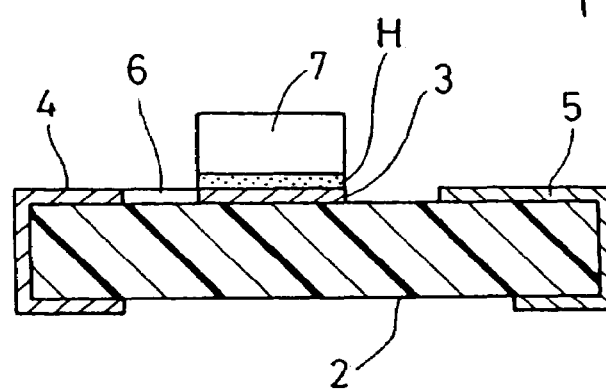
FIG. 6 is a longitudinal sectional view showing an LED chip bonded to an insulating substrate in the first embodiment.

As indicated by double-dashed lines in FIG. 5, when the rectangular LED chip 7 is placed on the rectangular die pad 3, the side surfaces of the LED chip 7 may not be in parallel with the side surfaces of the die pad 3 or the LED chip 7 may be offset from the center of the die pad 3. Even in such a case, with the above arrangement, the surface tension of the molten solder acts simultaneously to each side surface of the LED chip 7 and each side surface of the die pad 3. As a result, by self alignment due to the surface tension, the orientation of the LED chip 7 is automatically corrected so that each side of the LED chip 7 become parallel or generally parallel with a respective side of the die pad 3, and the position of the LED chip 7 is automatically corrected so that the LED chip 7 is accurately located at the center of the die pad 3.

By the hardening of the molten solder, the LED chip 7 is fixed with the position corrected as described above.

Through the experiment by the inventors, it has been found that the automatic correction by the self alignment due to the surface tension of the molten solder is reliably achieved when the length L1 and the width W1 of the rectangle of the die pad 3 are 0.50 to 1.50 times the length L0 and the width W0 of the rectangle of the LED chip 7, preferably 0.65 to 1.35 times, and most preferably 0.75 to 1.25 times. This holds true for bonding materials other than solder paste such as conductive paste.

In this way, in die-bonding the LED chip 7 to the die pad 3 on the insulating substrate 2, the self alignment by the die bonding material reduces the positional deviation of the LED chip 7 from the center of the die pad 3 while making each side surface of the LED chip 7 parallel or generally parallel with a respective side surface of the die pad 3. Therefore, the width of the insulating substrate and the molded portion 9 for packaging the LED chip 7 can be reduced as compared with that of the prior art device, whereby the size and weight of the chip-type LED device 1 can be reduced. Further, the variation of directionality of light emitted from the LED chip 6 can be reduced.

Figure 2:
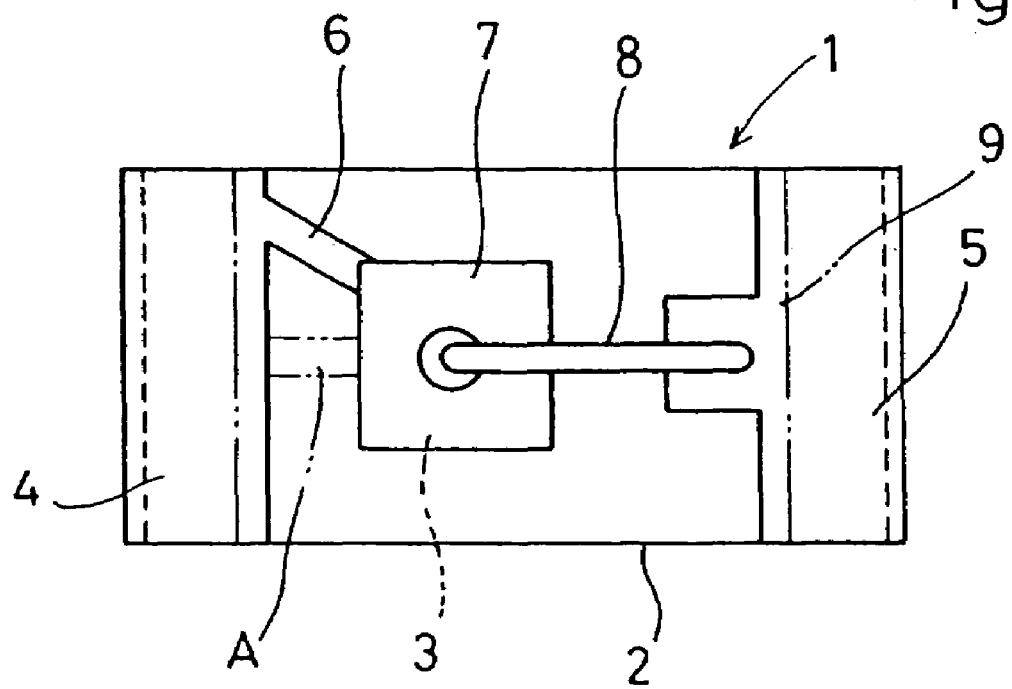
FIG. 2 is a plan view of FIG. 1.

In the first embodiment, the patterned conductor 6 for electrically connecting the die pad 3 to the first terminal electrode 4 does not extend straight as indicated by double-dashed lines in FIG. 2 but extends obliquely as indicated by the solid lines in FIG. 2, whereby the patterned conductor 6 is made relatively long. With such an arrangement, the contact area between the patterned conductor and the molded portion 9 packaging the patterned conductor can be increased, whereby moisture in the atmosphere, for example, is reliably prevented from entering through the patterned conductor 6.

Figure 7:
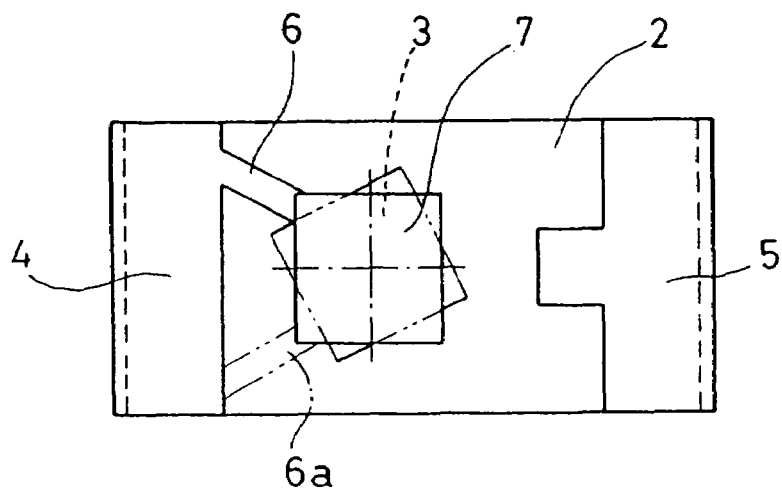
FIG. 7 is a plan view of FIG. 6.

The number of the patterned conductor is not limited to one. As shown in FIG. 7, two patterned conductors, i.e. the patterned conductor 6 indicated by solid lines and a patterned conductor 6a indicated by double-dashed lines may be provided.

Figure 8:
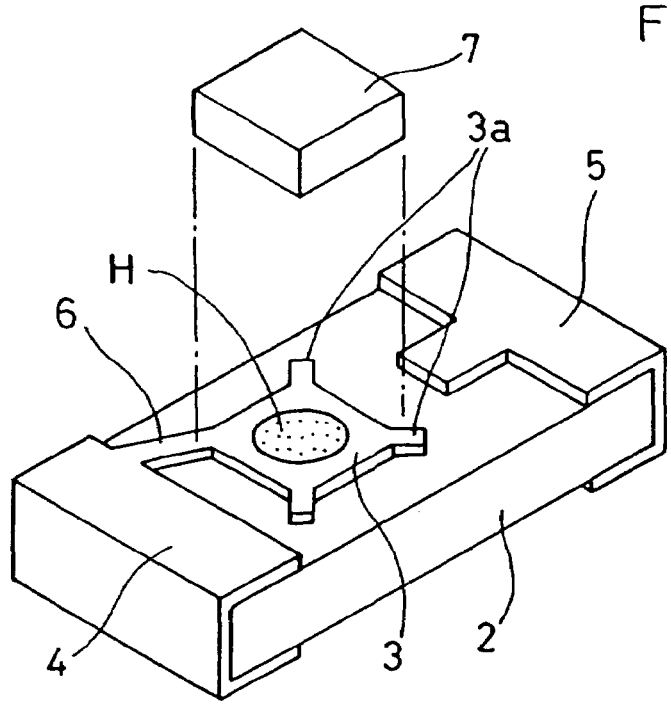
FIG. 8 is a perspective view showing a first variation of the first embodiment.

FIG. 8 shows a first variation of the first embodiment.

In the first variation, each corner of the rectangular die pad 3 formed on the upper surface of the insulating substrate 2 is integrally formed with a narrow extension 3a which extends outward from the die pad 3.

With this arrangement, when the solder paste H is applied onto the die pad 3 and melted, part of the molten solder spreads onto the obverse surface of the narrow extension 3a extending continuously outward from the die pad 3. Therefore, the thickness of the molten solder on the obverse surface of the die pad 3 can be reduced while the self alignment due to the surface tension of the molten solder is assured.

Figure 9:
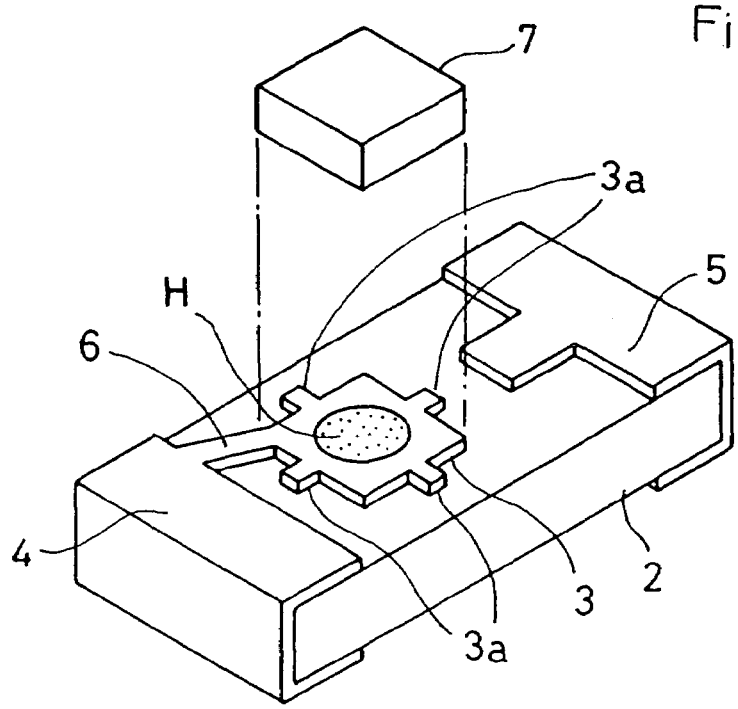
FIG. 9 is a perspective view showing a second variation of the first embodiment.
Figure 10:
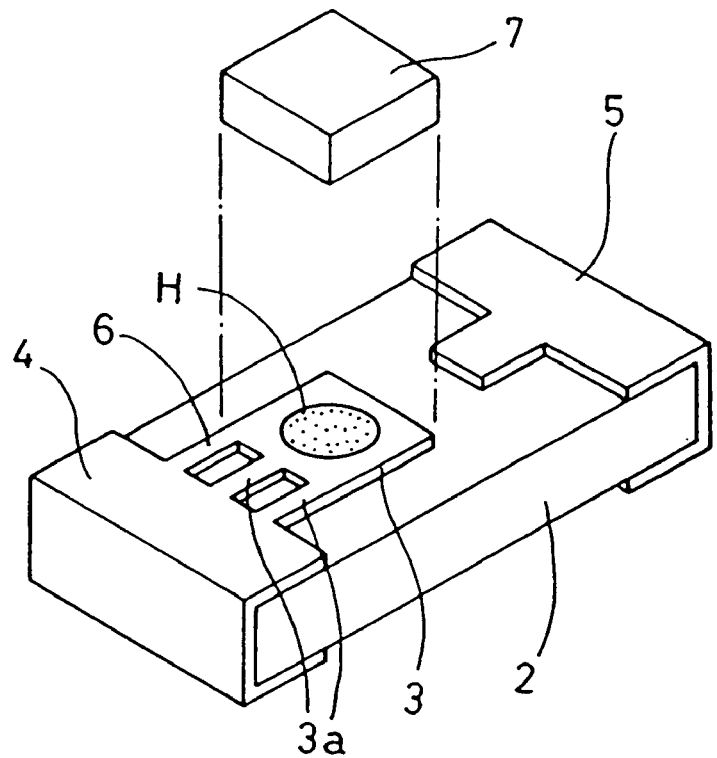
FIG. 10 is a perspective view showing a third variation of the first embodiment.

As a second variation of the first embodiment, the narrow extension 3a may be provided at each side surface of the die pad 3, as shown in FIG. 9. As a third variation of the first embodiment, a plurality of narrow extensions 3a may be provided at one side surface of the pad 3 so that the extensions also serve as the patterned conductor 6, as shown in FIG. 10. In these variations again, the thickness of the molten solder on the obverse surface of the die pad 3 can be reduced while the self alignment due to the surface tension of the molten solder is assured.

Figure 11:
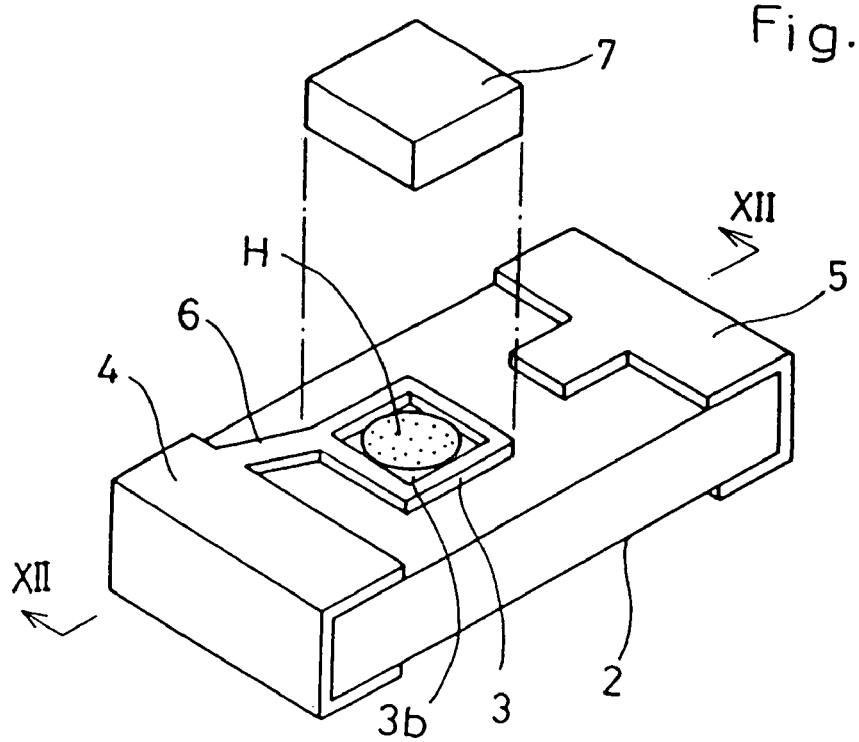
FIG. 11 is a perspective view showing a fourth variation of the first embodiment.
Figure 12:
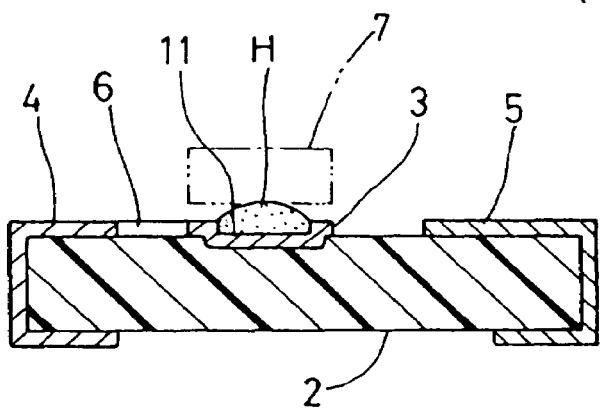
FIG. 12 is a sectional view taken along lines XII-XII in FIG. 11.
Figure 13:
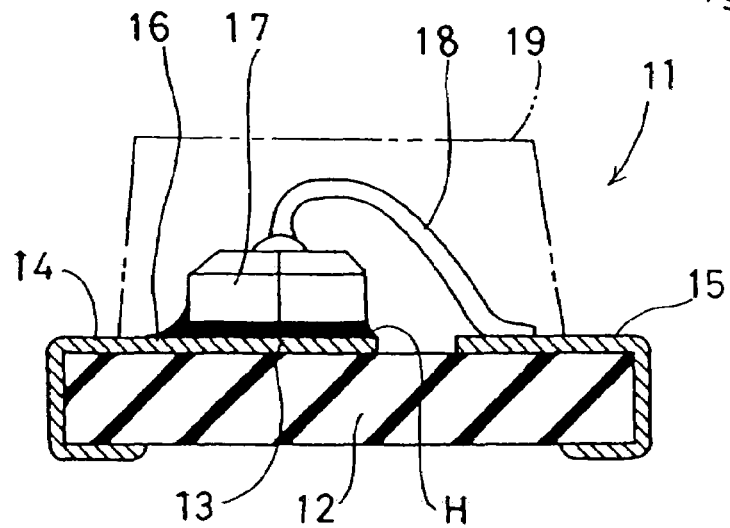
FIG. 13 is a longitudinal sectional view showing a chip-type LED device according to a second embodiment.
Figure 14:
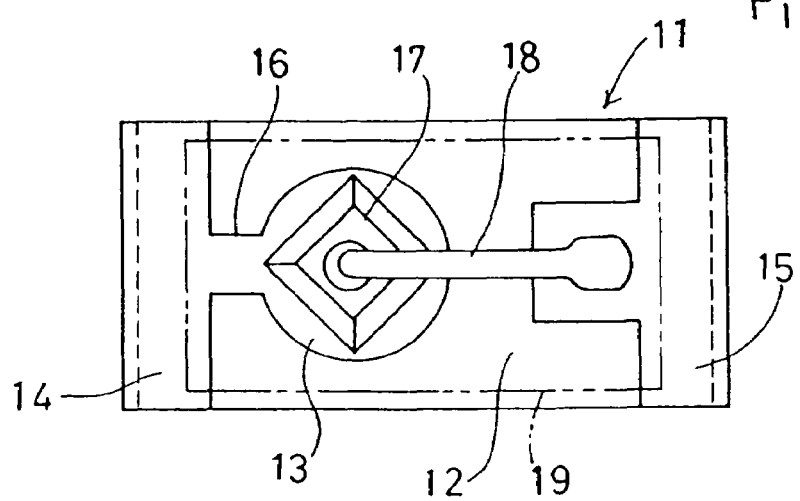
FIG. 14 is a plan view of FIG. 13.

FIGS. 11 and 12 show a fourth variation of the first embodiment.

In the fourth variation, the rectangular die pad 3 formed on the upper surface of the insulating substrate 2 is formed with a recess 3b of a size insufficient to receive the LED chip 7.

With such an arrangement, when the solder paste H applied to the obverse surface of the die pad 3 is melted with the LED chip 7 placed thereon, part of the molten solder is received in the recess 3b. Therefore, the thickness of the molten solder on the obverse surface of the die pad 3 can be reduced while the self alignment due to the surface tension of the molten solder is assured.

FIGS. 13-19 show a second embodiment of the present invention.

Indicated by the reference sign 11 in these figures is a chip-type LED device. The chip-type LED device 11 includes an insulating substrate 12 in the form of a chip. The insulating substrate 12 has an upper surface formed with a die pad 13 made of a metal film to have a circular configuration with a diameter D, and a pair of terminal electrodes 14 and 15 made of a metal film and provided on opposite sides of the die pad. The upper surface of the insulating substrate 12 is further formed with a narrow patterned conductor 16 made of a metal film and electrically connecting the terminal electrode 14 to the die pad 13.

The chip-type LED device 11 further includes an LED chip 17 bonded to the upper surface of the die pad 13, a thin metal wire 18 connecting an electrode on the upper surface of the LED chip 17 to the terminal electrode 15 by wire bonding, and a molded portion 19 made of a light-permeable synthetic resin such as a transparent resin for packaging the LED chip 17, the narrow patterned conductor 16 and the metal wire 18 on the upper surface of the insulating substrate 12. As viewed in plan, the LED chip 17 is square or generally square with side length B.

The terminal electrodes 14, 15 extend from the upper surface onto an end surface and a lower surface of the insulating substrate 12.

To bond the LED chip 17 onto the die pad 13 on the insulating substrate 12, the diameter D of the die pad 13 is made close to the diagonal dimension S of the square or generally square LED chip 7.

Figure 15:
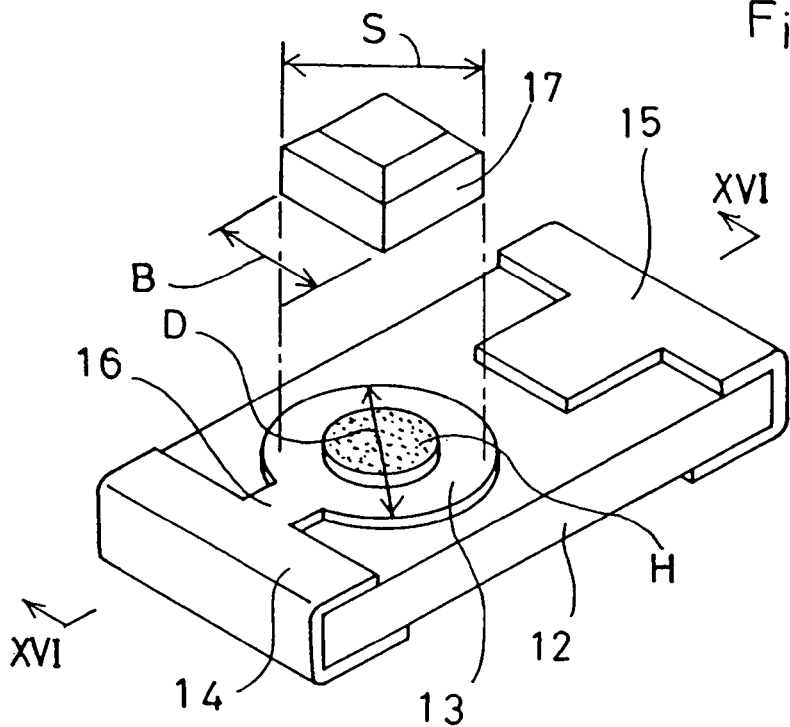
FIG. 15 is an exploded perspective view showing the chip-type LED device according to the second embodiment.
Figure 16:
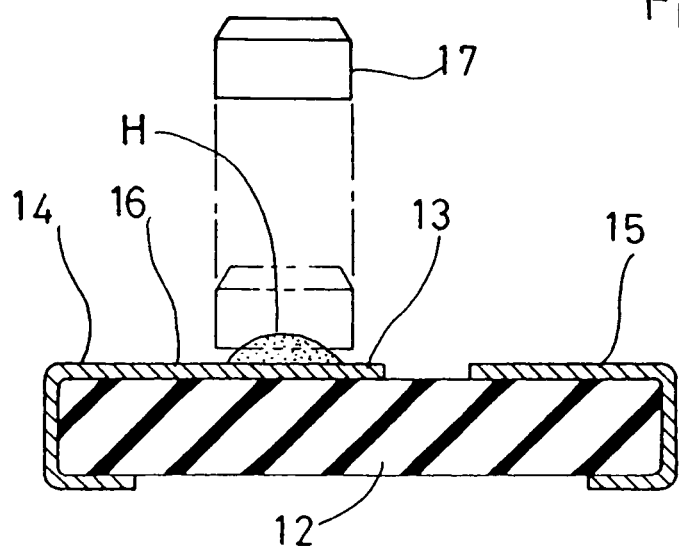
FIG. 16 is a sectional view taken along lines XVI-XVI in FIG. 15.

In die bonding, an appropriate amount of solder paste H is applied to the upper surface of the die pad 13, and then the LED chip 7 is placed on the solder paste H, as shown in FIGS. 15 and 16.

In placing the LED chip 17, it is only necessary to put the LED chip on the solder paste H, and it is unnecessary to accurately position the LED chip at the center of the die pad 13 or orient each corner of the LED chip 17 in a predetermined direction.

Thereafter, the entirety is heated to a temperature above the melting point of the solder to melt the solder paste H and then cooled to normal temperature for hardening the paste.

By the heating and melting of the solder paste H, the LED chip 17 is floated on the molten solder paste H. At this time, the molten solder paste H spreads, while alloying, over the entire obverse surface of the die pad 13 and also over the bottom surface and each of four side surfaces of the LED chip 17. Thus, surface tension of the molten solder paste H acts between the circumferential edge of the die pad 13 and each of the four side surface of the LED chip 17.

In this case, since the LED chip 17 is square or generally square while the die pad 13 is circular with a diameter D which approximates the diagonal dimension S of the LED chip 17, the LED chip 17 floating on the molten solder paste H undergoes self alignment for moving the LED chip to a position where the surface tension acts equally to each of the four side surfaces of the LED chip. Therefore, even when the LED chip 17 is placed at a position offset from the center of the die pad 13, the position is automatically corrected by self alignment so that the LED chip is located at or near the center of the die pad 13.

Figure 17:
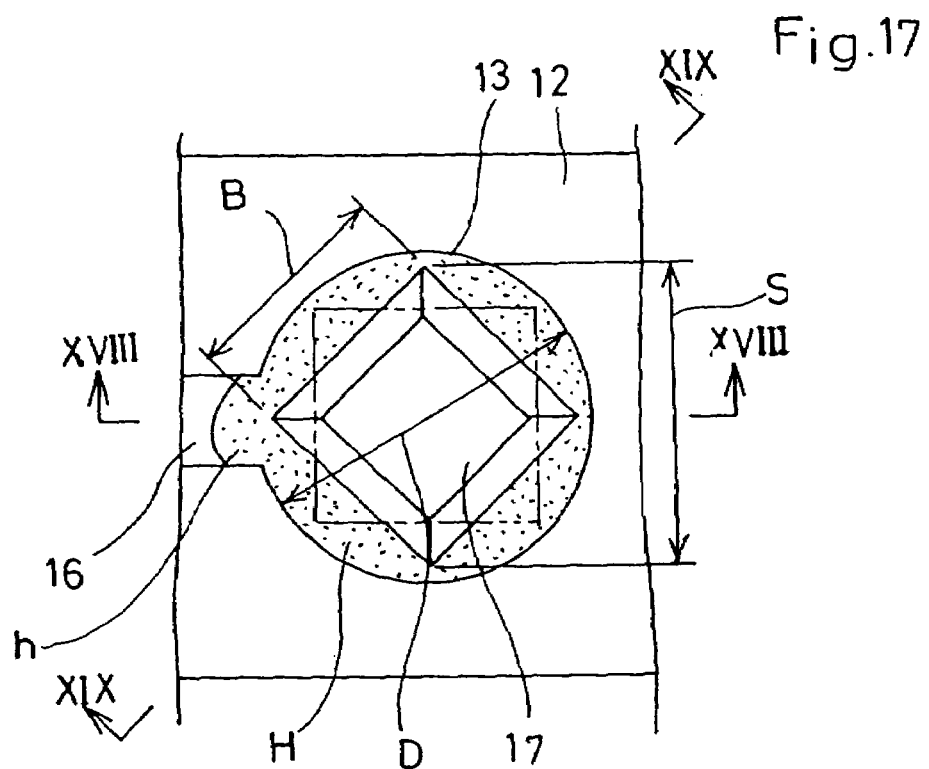
FIG. 17 is enlarged view showing the principal portion of FIG. 14.
Figure 18:
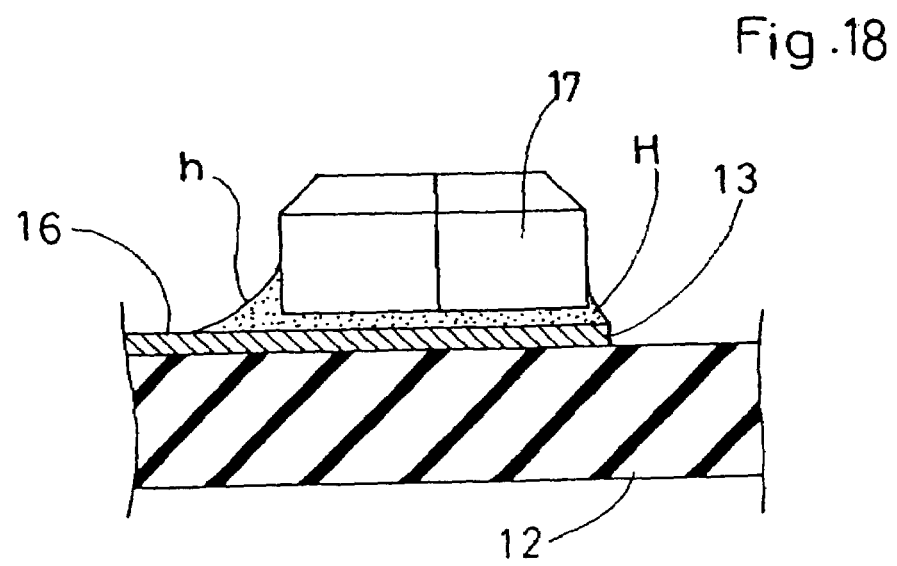
FIG. 18 is a sectional view taken along lines XVIII-XVIII in FIG. 17.

Further, as shown in FIGS. 17 and 18, part of the molten solder paste H spreads also toward the narrow patterned conductor 16 connecting the die pad 13 to the electrode terminal 14. Therefore, a bulged portion h projecting onto the narrow patterned conductor 16 is formed at the outer circumference of the molten solder paste H, and surface tension of the solder paste H acts also between the side surfaces of the LED chip 17 and the bulged portion h spreading onto the narrow patterned conductor 16. Therefore, by the self alignment due to the behavior of the solder paste to make the surface tension act equally onto each of the side surfaces, the orientation of the LED chip 17 floating on the molten solder paste H is automatically corrected so that one of the four corners of the LED chip 17 is oriented toward the narrow patterned conductor 16.

Figure 19:
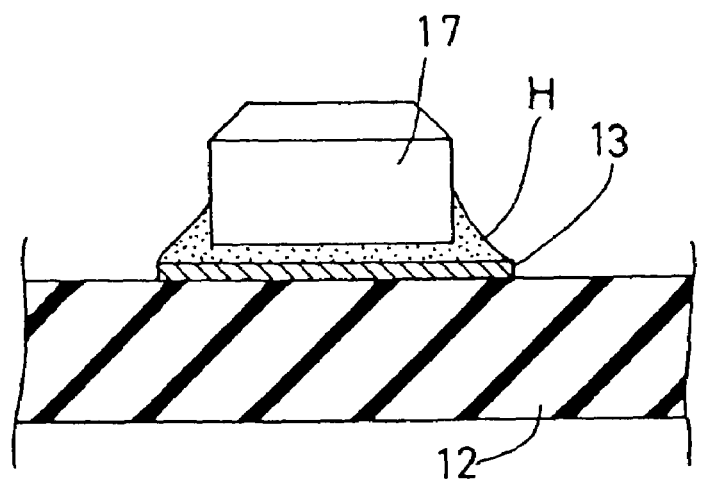
FIG. 19 is a sectional view taken along lines XIX-XIX in FIG. 17.

In this way, as shown in FIGS. 17, 18 and 19, automatic correction is performed so that the LED chip 7 is positioned at or near the center of die pad 13 and one of the four corners of the LED chip is oriented toward the narrow patterned conductor 16.

By the subsequent hardening of the solder paste H by cooling, the LED chip 17 is bonded at or near the center of the die pad 13 connected to the electrode terminal 14, with one of the corners of the LED chip 17 oriented toward the narrow patterned conductor 16 connected to the die pad 13 so that each of the corners is constantly oriented in a predetermined direction.

Through the experiment by the inventors, it has been found that the self alignment due to the surface tension of the molten solder is reliably achieved when the diameter D of the die pad 13 is 0.6 (lower limit) to 1.5 (upper limit) times the diagonal dimension S of the LED chip 17, and is more reliably achieved when 0.8 (lower limit) to 1.2 (upper limit) times.

Therefore, "a diameter close to a diagonal dimension of the semiconductor chip" as set forth in the claims of the present invention means the above-described range.

Figure 20:
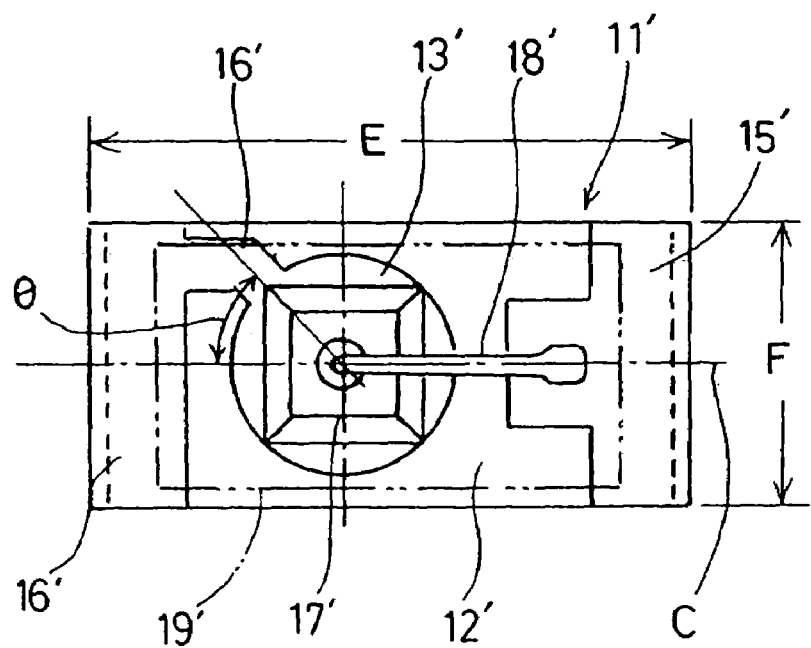
FIG. 20 is a plan view showing a variation of the second embodiment.

FIG. 20 shows a variation of the second embodiment.

In the chip-type LED device 11' of this variation, the die pad 13' is arranged, as viewed in plan, on a center line C connecting the electrode terminals 14', 15' provided at opposite ends of the insulating substrate 12' to each other. Specifically, as viewed in plan, the terminal electrode 14' and the terminal electrode 15' are arranged on a straight line with the die pad 13' interposed therebetween, and the narrow patterned conductor 16' connecting the die pad 13' to the electrode terminal 14' is arranged to extend from the circumference of the die pad 13 at a position deviating by an angle θ (=45 degrees) from the center line C connecting the electrode terminals 14' and 15' to each other, i.e. from the line of the electrodes 14', 15'. Similarly to the foregoing embodiments, an LED chip 17' is bonded on the upper surface of the die pad 13' with solder paste H, and an electrode on the LED chip 17' is connected to the electrode terminal 15' by wire bonding using a metal wire 18'. The LED chip 17', the narrow patterned conductor 16' and the metal wire 18' on the upper surface of the insulating substrate 12' are packaged with a molded portion 19' made of a transparent synthetic resin.

With such an arrangement, when solder paste H applied to the upper surface of the die pad 13' is melted with the LED chip 17' placed thereon, self alignment due to the surface tension of the solder paste H occurs so that the LED chip 17' is automatically located at or near the center of the die pad 13', while, at the same time, one of the corners is automatically oriented toward the narrow patterned conductor 16'. As shown in FIG. 20, by subsequently fixing the LED chip in this state, the LED chip 17' can be bonded so that, among the four sides of the LED chip, a pair of opposite sides extend parallel or generally parallel with the center line C connecting the electrode terminals 14' and 15' to each other, i.e. with the line of the electrode terminals 14', 15' while the other pair of opposite sides extend perpendicularly or generally perpendicularly to the center line C connecting the electrode terminals 14' and 15' to each other. Therefore, the width F and the length E of the chip-type LED device 11' can be made smaller than in the structure shown in FIG. 14 in which the four sides of the LED chip are inclined relative to the line of the electrode terminals 14' and 15'.

Figure 21:
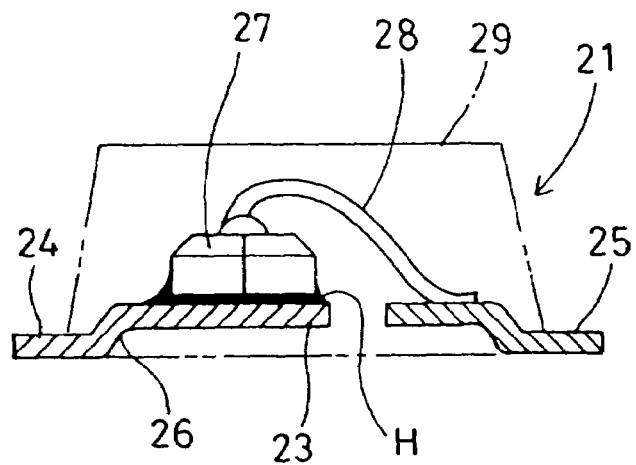
FIG. 21 is an exploded perspective showing a chip-type LED device according to a third embodiment.
Figure 22:
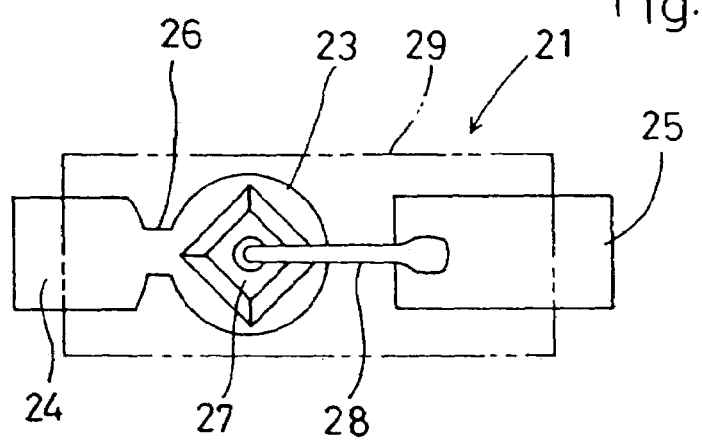
FIG. 22 is a plan view of FIG. 21.

FIGS. 21 and 22 show a third embodiment of the present invention.

In the chip-type LED device 21 according to the third embodiment, instead of the paired electrode terminals and the die pad all of which comprise a metal film formed on an insulating substrate, a pair of electrode terminals and a die pad all of which comprise a relatively thick metal plate are provided, and the insulating substrate is not used.

Specifically, both of the electrode terminal 25 and the electrode terminal 24 connected to the circular die pad 23 via a narrow patterned conductor 26 are made of a metal plate. Similarly to the foregoing embodiments, an LED chip 27 is bonded on the upper surface of the die pad 23 with solder paste H, and an electrode on the LED chip 27 is connected to the electrode terminal 25 by wire bonding using a metal wire 28. The LED chip 27, the narrow patterned conductor 26 and the metal wire 28 are packaged with a molded portion 29 made of a light-permeable synthetic resin such as a transparent resin.

With such an arrangement, a chip-type LED 21 which does not include an insulating substrate can be formed by using a metal plate.

Figure 23:
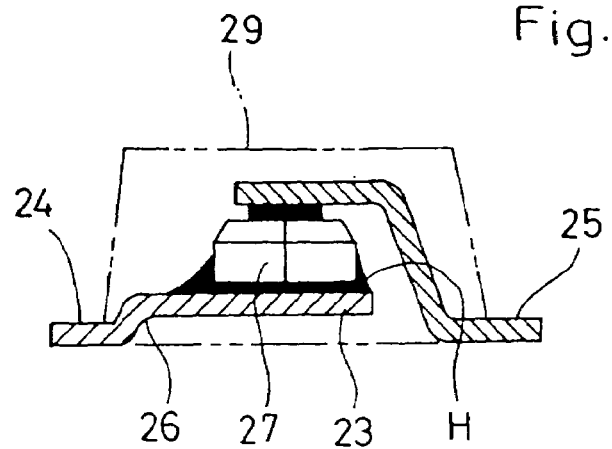
FIG. 23 is a longitudinal sectional view showing a variation of the third embodiment.

As shown in FIG. 23, in a variation of the third embodiment, the electrode terminal 25 may be elongated for direct connection to the LED chip 27 instead of the connection to the LED chip 27 by wire bonding using a metal wire 28, whereby the wire bonding using a metal wire can be eliminated.

In the third embodiment again, it is preferable that the diameter D of the die pad 23 is 0.6 (lower limit) to 1.5 (upper limit) times the diagonal dimension of the LED chip 27, and more preferably, 0.8 (lower limit) to 1.2 (upper limit) times the diagonal dimension of the LED chip. Further, in the third embodiment again, similarly to the variation of the second embodiment shown in FIG. 20, the narrow patterned conductor 26 may be arranged to extend from the circumference of the die pad 23 at a position deviating by an angle θ (=45 degrees) from the center line connecting the electrode terminals 24 and 25 to each other, i.e. from the line of the electrodes 24, 25. In this case, the width and length of the chip-type LED device 21 can be shortened for size reduction.

In the foregoing embodiments, a chip-type LED device using an LED chip is described as an example of semiconductor device. However, the present invention is not limited thereto and is also applicable to such a semiconductor device as a transistor in which more than two electrode terminals are connected to a single semiconductor chip, as well as to a diode having a structure similar to that of the chip-type LED device.

The invention claimed is:

1. A semiconductor device comprising:
   an insulating substrate having an obverse surface, a reverse surface opposite to the obverse surface, and a plurality of side surfaces extending between the obverse surface and the reverse surface, the substrate being elongate in one direction;
   a die pad made of a metal film and formed on the obverse surface of the substrate;
   a pair of electrode terminals made of a metal film and extending from the obverse surface of the substrate onto the reverse surface via selected ones of the side surfaces;
   a semiconductor chip bonded to the die pad with a die bonding material; and
   a molded portion made of a synthetic resin covering the obverse surface of the substrate without covering the side surfaces and the reverse surface for packaging the semiconductor chip;
   wherein a narrow patterned conductor made of a metal film is provided between the die pad and one of the electrode terminals to integrally connect the die pad and the electrode terminal to each other, the die pad having a length and a width which are 0.50 to 1.50 times a length and a width of the semiconductor chip, respectively;
   wherein the semiconductor chip comprises an LED chip, the molded portion being light-permeable; and
   wherein the die pad, the pair of electrode terminals and the narrow patterned conductor in combination provide an overall conductor pattern that is asymmetrical with respect to a longitudinal centerline of the insulating substrate extending in said one direction, the narrow patterned conductor extending obliquely and being offset from the longitudinal centerline of the insulating substrate.

2. The semiconductor device according to claim 1, wherein the die pad has a side surface integrally formed with a narrow extension projecting outward from the die pad.

3. The semiconductor device according to claim 1, wherein the die pad is formed with a recess of a size insufficient to receive the semiconductor chip.

4. The semiconductor device according to claim 1, wherein the die pad has a side surface integrally formed with a narrow extension projecting outward from the die pad, and wherein the die pad is formed with a recess of a size insufficient to receive the semiconductor chip.

* * * * *